(12) United States Patent
Onihashi (10) Patent No.: US 10,564,300 B2
(45) Date of Patent: Feb. 18, 2020

(54) RADIATION DETECTOR (71) Applicant: Toshiba Electron Tubes & Devices Co., Ltd., Otawara-shi (JP)

(72) Inventor: Hiroshi Onihashi, Nasushiobara (JP)

(73) Assignee: CANON ELECTRON TUBES & DEVICES CO., LTD., Otawara-shi ( * ) Notice: Subject to any disclaimer, the term of this patent is extended or adjusted under 35 U.S.C. 154(b) by 0 days.

(21) Appl. No.: 15/905,381

(22) Filed: Feb. 26, 2018

(65) Prior Publication Data

US 2019/0018152 A1 Jan. 17, 2019

(30) Foreign Application Priority Data

Jul. 11, 2017 (JP) ................................ 2017-135673

(51) Int. Cl.
*G01T 1/24* (2006.01)
*G01T 1/20* (2006.01)
*H01L 27/146* (2006.01)
*H01L 31/0232* (2014.01)
*G21K 4/00* (2006.01)

(52) U.S. Cl.
CPC ............ *G01T 1/247* (2013.01); *G01T 1/2018* (2013.01); *H01L 27/14603* (2013.01); *H01L 27/14676* (2013.01); *H01L 31/02322* (2013.01); *G21K 4/00* (2013.01)

(58) Field of Classification Search
USPC ................................................... 250/370.08
See application file for complete search history.

(56) References Cited

U.S. PATENT DOCUMENTS 5,894,129 A * 4/1999 Pool ...................... A61B 6/145
250/370.09
6,404,854 B1 * 6/2002 Carroll ................... A61B 6/145
348/E3.02

(Continued)

FOREIGN PATENT DOCUMENTS

DE         10361397 A1    7/2005
JP       2013-033030 A    2/2013

(Continued)

OTHER PUBLICATIONS

Notification, of Reason(s) for Refusal dated Dec. 11, 2017, in Japanese Patent Application No. 2017-135673 (with English Translation).

*Primary Examiner* — David P Porta
*Assistant Examiner* — Carolyn Fin
(74) *Attorney, Agent, or Firm* — Oblon, McClelland, Maier & Neustadt, L.L.P.

(57) ABSTRACT

A radiation detector includes a substrate, control lines provided on the substrate and extending in a first direction, data lines provided on the substrate and extending in a second direction crossing the first direction, and detection parts arranged in a matrix. Each detection part includes a thin film transistor and a conversion part converting radiation or light into electricity. Further, a control circuit switches an on state and an off state of each thin film transistor and a signal detection circuit reads out image data in the on state of the thin film transistor. Further, the detector judges a start time of radiation incidence based on a value of the image data read out in the on state of each thin film transistor.

8 Claims, 7 Drawing Sheets

(56) References Cited

U.S. PATENT DOCUMENTS

| | | | |
|---|---|---|---|
| 6,801,598 B2* | 10/2004 | Tashiro | A61B 6/00 |
| | | | 250/205 |
| 8,288,732 B2 | 10/2012 | Okada | |
| 8,748,839 B2 | 6/2014 | Tajima | |
| 9,554,759 B2 | 1/2017 | Hawver et al. | |
| 2005/0151086 A1 | 7/2005 | Spahn | |
| 2008/0136743 A1 | 6/2008 | Okada | |
| 2013/0009069 A1 | 1/2013 | Okada | |
| 2013/0082186 A1 | 4/2013 | Tajima | |
| 2014/0112448 A1* | 4/2014 | Takenaka | H04N 5/32 |
| | | | 378/114 |
| 2015/0034833 A1 | 2/2015 | Blanchon et al. | |
| 2015/0078530 A1 | 3/2015 | Hawver et al. | |
| 2016/0227140 A1 | 8/2016 | Colbeth et al. | |
| 2017/0227475 A1* | 8/2017 | Shin | G01N 23/04 |
| 2018/0129120 A1* | 5/2018 | Sato | G03B 7/08 |

FOREIGN PATENT DOCUMENTS

| | | |
|---|---|---|
| JP | 2014-526178 A | 10/2014 |
| JP | 2016-134776 A | 7/2016 |
| KR | 10-2017-0016508 A | 2/2017 |
| WO | WO 2017/002301 A1 | 1/2017 |

* cited by examiner

RADIATION DETECTOR

CROSS-REFERENCE TO RELATED APPLICATIONS

This application is based upon and claims the benefit of priority from Japanese Patent Application No. 2017-135673, filed on Jul. 11, 2017; the entire contents of which are incorporated herein by reference.

FIELD

The embodiment of the invention relates to a radiation detector.

BACKGROUND

There is an X-ray detector as one example of a radiation detector. The X-ray detector is provided with, for example, an array substrate including a plurality of photoelectric conversion parts, and a scintillator provided on the plurality of photoelectric conversion parts and converting an X-ray to fluorescence. The photoelectric conversion part is provided with a photoelectric conversion element converting the fluorescence from the scintillator to a charge, a thin film transistor performing switching of storing and release of the charge, a storing capacitor storing the charge, and the like.

In general, the X-ray detector reads out an image data as follows. First, the detector recognizes X-ray incidence from a signal input externally. Next, the detector reads out the stored charge as the image data by turning on a thin film transistor of the photoelectric conversion part performing reading after the passage of a pre-determined time.

However, in this way, since the start of the operation of the X-ray detector depends on a signal from the outside, there is a problem that a processing time becomes longer due to a time lag or the like.

Here, when the thin film transistor of a semiconductor element is irradiated with the X-ray, a current flows between a drain electrode and a source electrode, even if the thin film transistor is in an off state. The drain electrode of the thin film transistor is electrically connected to a data line.

Thus, a technique is proposed, the thin film transistor is set to the off state, and then based on a difference between a value of the current flowing in the data line when the X-ray is irradiated and a value of the current flowing in the data line when the X-ray is not irradiated, a start time of the X-ray incidence is detected.

However, the value of the current flowing in the data line when the thin film transistor is in the off state becomes extremely small. Furthermore, since a large amount of X-ray irradiation to a human body has an adverse effect on health, the X-ray irradiation to the human body is suppressed to the minimum necessary. Therefore, in the case of the X-ray detector used for medical application, the intensity of the incident X-ray is extremely weak, and the value of the current flowing in the data line becomes further small when the thin film transistor is in the off state.

Therefore, there is a fear that even if the value of the current flowing in the data line is detected when the thin film transistor is in the off state, it is difficult to detect accurately the start time of the X-ray incidence.

Thus, it has been desired to develop a radiation detector capable of detecting accurately the start time of the radiation incidence.

DETAILED DESCRIPTION

According to one embodiment of the invention, a radiation detector includes a substrate, a plurality of control lines provided on the substrate and extending in a first direction, a plurality of data lines provided on the substrate and extending in a second direction crossing the first direction, a plurality of detection parts including a thin film transistor electrically connected to the corresponding control lines and the corresponding data lines, and detecting radiation directly or in cooperation with a scintillator, a control circuit switching an on state and an off state of the thin film transistor, a signal detection circuit reading out an image data in the on state of the thin film transistor, and an incident radiation detection part judging a start time of radiation incidence based on a value of the image data read out in the on state of the thin film transistor.

The embodiment will be described with reference to the accompanying drawings. In the drawings, similar components are marked with like reference numerals, and the detailed description is omitted as appropriate.

The radiation detector according to the embodiment can be applied to various radiations such as a γ-ray other than an X-ray. Here, the case of the X-ray as a representative of radiations is described as one example. Therefore, the detector can be also applied to other radiation by replacing "X-ray" of the following embodiments with "other radiation".

The X-ray detector 1 illustrated below is an X-ray plane sensor detecting an X-ray image which is a radiation image. The X-ray plane sensor includes a direct conversion method and an indirect conversion method broadly.

The direct conversion method is a method that a photoconductive charge (charge) generated inside a photoconductive film by the X-ray incidence is introduced directly to a storing capacitor for charge storage.

The indirect conversion method is a method that the X-ray is converted to fluorescence (visible light) by a scintillator, the fluorescence is converted to the charge by a photoelectric conversion element such as a photodiode, and the charge is introduced to the storing capacitor.

In the following, the X-ray detector 1 of the indirect conversion method is illustrated as one example, however the invention can be applied to the X-ray detector of the indirect conversion method as well.

That is, the X-ray detector may be a detection part as long as it includes a detection part converting the X-ray to electric information. The X-ray detection part can be, for example, a detector that detects the X-ray directly or in cooperation with the scintillator.

Since an already known art can be applied to the X-ray detector of the direct conversion method, the detailed description will be omitted.

The X-ray detector 1 can be used for, for example, general medical application or the like, and the application is not limited.

Figure 1:
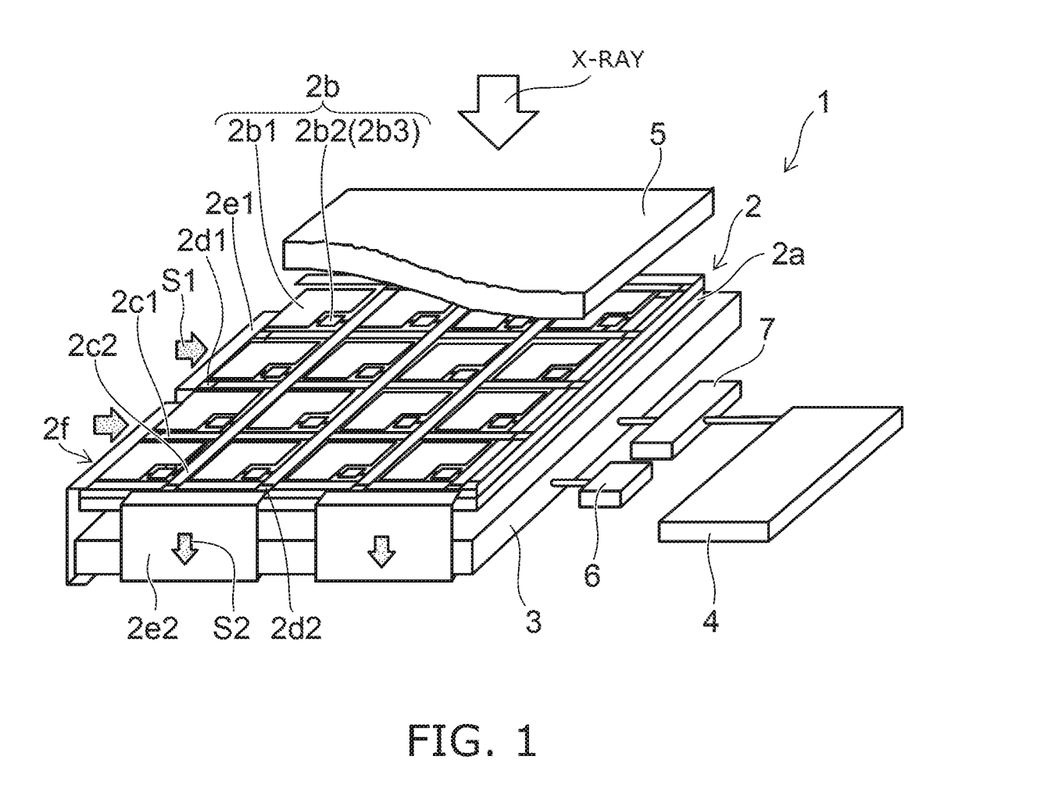
FIG. 1 is a schematic perspective view for illustrating an X-ray detector.

FIG. 1 is a schematic view for illustrating the X-ray detector 1.

In FIG. 1, a bias line $2c3$ or the like is omitted.

Figure 2:
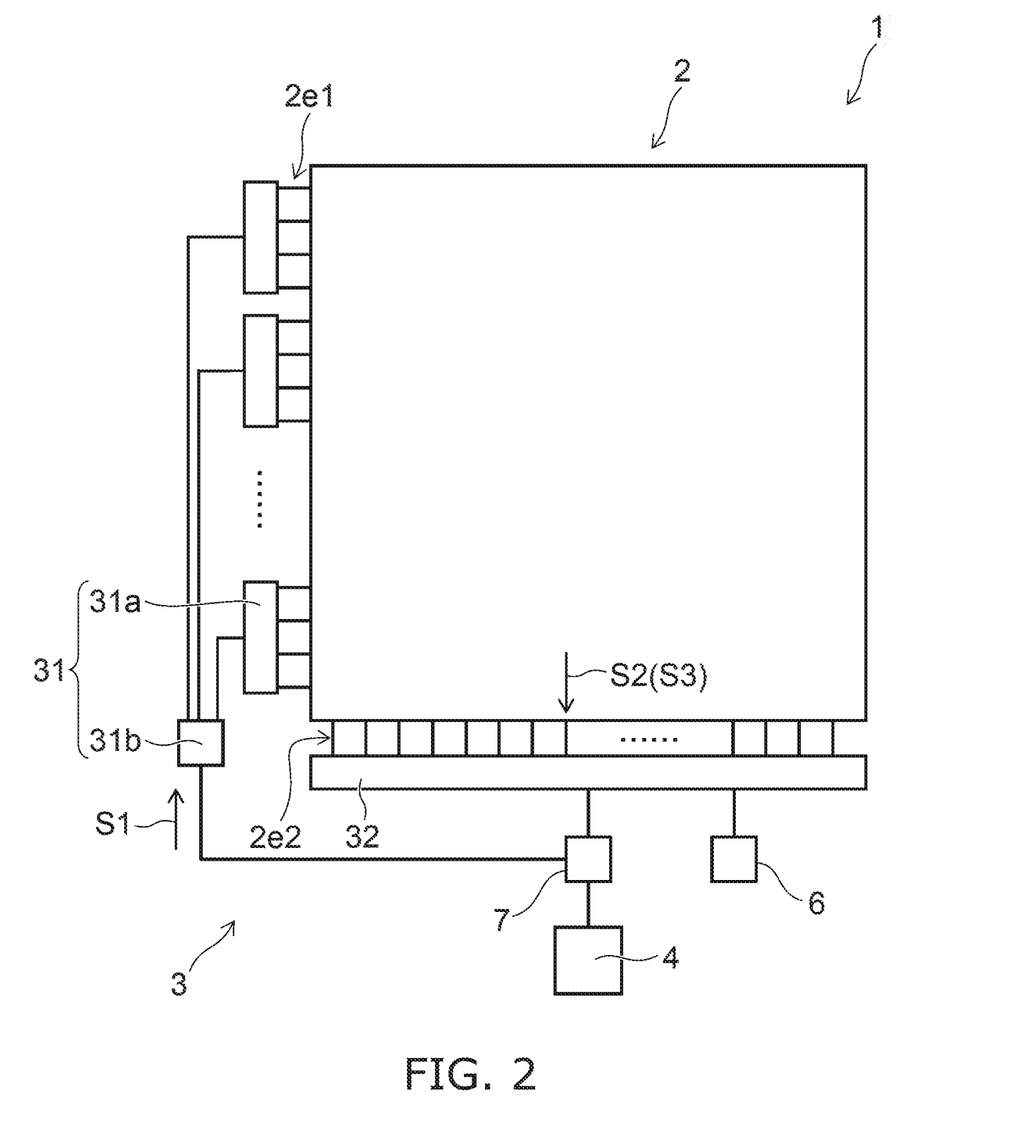
FIG. 2 is a block diagram of the X-ray detector.

FIG. 2 is a block diagram of the X-ray detector 1.

Figure 3:
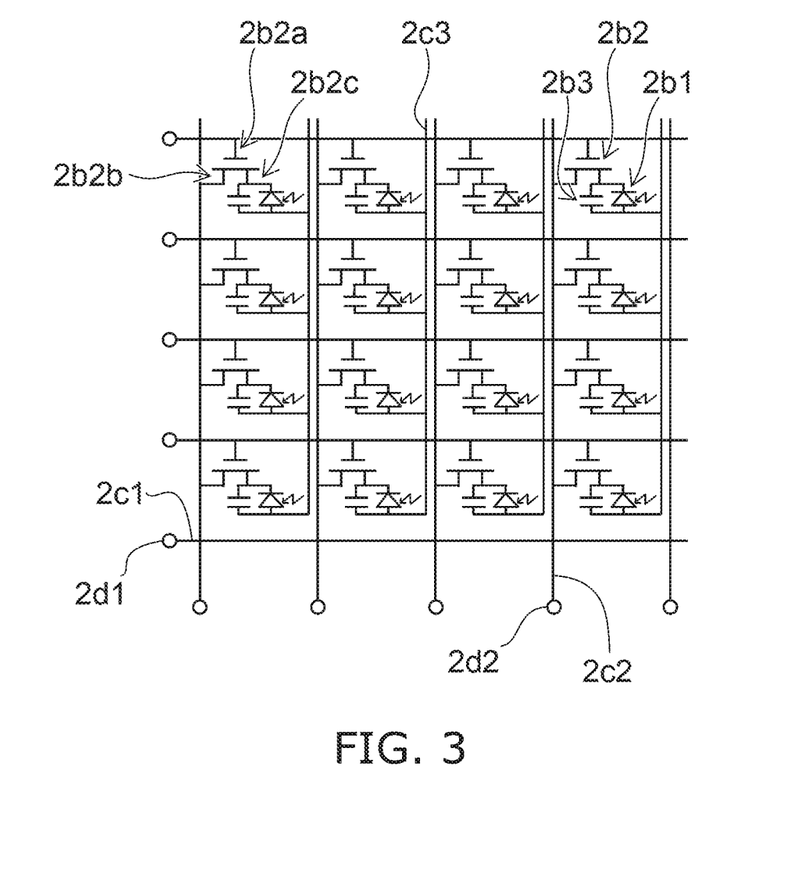
FIG. 3 is a circuit diagram of an array substrate.

FIG. 3 is a circuit diagram of an array substrate 2.

As shown in FIG. 1 to FIG. 3, the X-ray detector 1 is provided with the array substrate 2, a signal processing part 3, an image processing part 4, a scintillator 5, an incident X-ray detection part 6, and a memory 7.

The array substrate 2 converts the fluorescence converted from the X-ray by the scintillator 5 to an electric signal.

The array substrate 2 includes a substrate $2a$, a photoelectric conversion part $2b$, a control line (or gate line) $2c1$, a data line (or signal line) $2c2$, a bias line $2c3$, a wiring pad $2d1$, a wiring pad $2d2$, and a protection layer $2f$ or the like.

In the embodiment, the photoelectric conversion part $2b$ serves as a detection part detecting the X-ray in cooperation with the scintillator 5.

The number of the photoelectric conversion part $2b$, the control line $2c1$, the data line $2c2$, and the bias line $2c3$ or the like is not limited to the illustration.

The substrate $2a$ is plate-shaped, and is formed from a light transmissive material such as a non-alkali glass.

The photoelectric conversion part $2b$ is provided in a plurality on one surface of the substrate $2a$.

The photoelectric conversion part $2b$ is provided in a region drawn by the control line $2c1$ and the data line $2c2$. The plurality of photoelectric conversion parts $2b$ are arranged in a matrix.

One photoelectric conversion part $2b$ corresponds to one picture element (pixel) in the X-ray image.

Each of the plurality of photoelectric conversion parts $2b$ is provided with a photoelectric conversion element $2b1$, and a thin film transistor (TFT) $2b2$.

As shown in FIG. 3, a storing capacitor $2b3$ to which the charge converted by the photoelectric conversion element $2b1$ is supplied can be provided. The storing capacitor $2b3$ is, for example, rectangular flat plate-shaped, and can be provided under the respective thin film transistor $2b2$. However, depending on a capacity of the photoelectric conversion element $2b1$, the photoelectric conversion element $2b1$ can serve as the storing capacitor $2b3$.

In the case where the photoelectric conversion element $2b1$ serves as the storing capacitor $2b3$ (the case where the storing capacitor $2b3$ is omitted), storing and release of the charge is performed in the photoelectric conversion element $2b1$.

In this case, the charge is released from the photoelectric conversion part $2b$ by turning on the thin film transistor $2b2$, and the charge is stored by turning off the thin film transistor $2b2$.

In the case where the storing capacitor $2b3$ is provided, a definite charge is stored in the storing capacitor $2b3$ from the bias line $2c3$ if the thin film transistor $2b2$ is turned off, and the stored charge stored in the storing capacitor $2b3$ is released if the thin film transistor is turned on.

In the following, the case where the storing capacitor $2b3$ is provided is illustrated as one example.

The photoelectric conversion element $2b1$ can be, for example, a photodiode or the like.

The thin film transistor $2b2$ performs switching of storing and release of the charge to the storing capacitor $2b3$. The thin film transistor $2b2$ can include a semiconductor material such as amorphous silicon (a-Si) or polysilicon (p-Si). The thin film transistor $2b2$ includes a gate electrode $2b2a$, a drain electrode $2b2b$ and a source electrode $2b2c$. The gate electrode $2b2a$ of the thin film transistor $2b2$ is electrically connected to the corresponding control line $2c1$. The drain electrode $2b2b$ of the thin film transistor $2b2$ is electrically connected to the corresponding data line $2c2$.

That is, the thin film transistor $2b2$ is electrically connected to the corresponding control line $2c1$ and the corresponding data line $2c2$. The source electrode $2b2c$ of the thin film transistor $2b2$ is electrically connected to the corresponding photoelectric conversion element $2b1$ and the storing capacitor $2b3$. The storing capacitor $2b3$ and the anode side of the photoelectric conversion element $2b1$ are electrically connected to the corresponding bias line $2c3$ (see FIG. 3).

The control line $2c1$ is provided in a plurality to be parallel to each other with a prescribed spacing. The control lines $2c1$ extend, for example, in a row direction (corresponding to one example of a first direction).

One control line $2c1$ is electrically connected to one of a plurality of wiring pads $2d1$ provided near the periphery of the substrate $2a$. One wiring pad $2d1$ is electrically connected to one of the plurality of wirings provided on the flexible printed board $2e1$. Other ends of the plurality of wirings provided on the flexible printed board $2e1$ are electrically connected to a control circuit 31 provided in the signal processing part 3, respectively.

The data line $2c2$ is provided in a plurality to be parallel to each other with a prescribed spacing. The data lines $2c2$ extend, for example, in a column direction (corresponding to one example of a second direction) orthogonal to the row direction.

One data line $2c2$ is electrically connected to one of a plurality of wiring pads $2d2$ provided near the periphery of the substrate $2a$. One of the plurality of wirings provided on the flexible printed board $2e2$ is electrically connected to one wiring pad $2d2$. Other ends of the plurality of wirings provided on the flexible printed board $2e2$ are electrically connected to a signal detection circuit 32 provided in the signal processing part 3, respectively.

As shown in FIG. 3, the bias line $2c3$ is provided to be parallel to the data line $2c2$.

The bias line $2c3$ is electrically connected to a bias power source not shown. The bias power source not shown can be provided, for example, on the signal processing part 3 or the like.

The bias line $2c3$ is not always necessary, and may be provided as necessary. In the case where the bias line $2c3$ is not provided, the storing capacitor $2b3$ and the anode side of the photoelectric conversion element $2b1$ are electrically connected to the ground in place of the bias line $2c3$.

The control line $2c1$, the data line $2c2$, and the bias line $2c3$ can be formed based on, for example, a low resistance metal such as aluminum and chromium or the like.

A protection layer $2f$ covers the photoelectric conversion part $2b$, the control line $2c1$, the data line $2c2$, and the bias line $2c3$.

The protection layer $2f$ includes, for example, at least one of an oxide insulating material, a nitride insulating material, oxynitride insulating material, and a resin material.

The signal processing part 3 is provided on an opposite side of the array substrate 2 to the scintillator 5.

The signal processing part 3 is provided with the control circuit 31 and the signal detection circuit 32.

The control circuit 31 switches between the on state and the off state of the thin film transistor $2b2$.

As shown in FIG. 2, the control circuit 31 includes a plurality of gate drivers $31a$ and a column selection circuit $31b$.

A control signal S1 is input from the image processing part 4 or the like to the column selection circuit 31$b$. The column selection circuit 31$b$ inputs the control signal S1 to the corresponding gate driver 31$a$ in accordance with a scanning direction of the X-ray image.

The gate driver 31$a$ inputs the control signal S1 to the corresponding control line 2$c$1.

For example, the control circuit 31 inputs the control signal S1 sequentially to every control line 2$c$1 via the flexible printed board 2$e$1. The thin film transistor 2$b$2 is turned on by the control signal S1 inputted to the control line 2$c$1, and the charge (image data signal S2) from the photoelectric conversion part 2$b$ (storing capacitor 2$b$3) can be received.

In the specification, the data read out when the thin film transistor 2$b$2 is in the on state is referred to as "image data S2", and the data read out when the thin film transistor 2$b$2 is in the off state is referred to as "correction data".

The signal detection circuit 32 reads out the charge (image data S2) from the photoelectric conversion part 2$b$ (storing capacitor 2$b$3) when the thin film transistor 2$b$2 is in the on state. The signal detection circuit 32 converts the read out image data S2 (analog signal) to digital signals sequentially.

The signal detection circuit 32 reads out further the correction data S3 when the thin film transistor 2$b$2 is in the off state. The signal detection circuit 32 converts the read out correction data S3 (analog signal) to digital signals sequentially.

The signal detection circuit 32 can read out the correction data S3 either before reading out the image data S2, after reading out the image data S2, or before reading out the image data S2 and after reading out the image data S2.

The control circuit 31 can input the control signal S1 switching the on state and the off state of the thin film transistor 2$b$2 for each of the plurality of control lines 2$c$1.

The signal detection circuit 32 can read out the correction data S3 every time the control signal S1 is input.

The signal detection circuit 32 can give an image index for coupling the image data S2 with the read out correction data S3 either before reading out the relevant image data S2, after reading out the relevant image data S2, or before reading out the relevant image data S2 and after reading out the relevant image data S2.

The signal detection circuit 32 can also convert a differential output of the read out image data S2 and the read out correction data S1 to the digital signal, and transmit to the image processing part 4.

In this way, since the corrected image data can be input to the image processing part 4, real-time performance can be improved.

In the case where the incident radiation detection part 6 judges the incidence of the X-ray starts, the signal detection circuit 32 can further read out the image data S2 when the thin film transistor 2$b$2 is in the on state.

The image data S2, the correction data S3, and the image index will be described later in detail.

As described previously, during the incidence of the X-ray, the current from the thin film transistor 2$b$2 in the off state flows in. Therefore, during the incidence of the X-ray, a sampling time (time of first sampling signal 21) of reading out the image data S2 and a sampling time (time of second sampling signal 22) of reading out the correction data S3 are preferable to be short.

On the other hand, after the end of the X-ray incidence, the current from the thin film transistor 2$b$2 in the off state does not flow in. Therefore, after the end of the X-ray incidence, even if the sampling time of reading out the image data S2 and a time during which the thin film transistor 2$b$2 is in the on state are lengthened, an image spot does not occur. If the sampling time of reading out the image data S2 and the time during which the thin film transistor 2$b$2 is in the on state are lengthened, quality of the X-ray image can be improved.

In this case, since the irradiation time of the X-ray is short, the sampling time of reading out the image data S2 and the time during which the thin film transistor 2$b$2 is in the on state after the detection of the incidence of the X-ray can be more lengthened than the sampling time of reading out the image data S2 and the sampling, time of reading out the correction data S3 before the detection of the X-ray.

In this way, the occurrence of the image spot can be suppressed and the quality of the X-ray image can be improved.

The memory 7 is electrically connected between the signal detection circuit 32 and the image processing part 4. The memory 7 saves temporarily the image data S2 and the correction data S3 converted to the digital signal.

At this time, it is possible that the image data S2 and the correction data S3 to which an image index is given are saved.

The image processing part 4 configures the X-ray image based on the image data S2 saved in the memory 7. The image processing part 4 corrects the image data S2 by using the correction data S3. At this time, the image processing part 4 extracts the correction data S3 based on the image index, and can correct the image data S2 coupling with the correction data S3 by using the extracted correction data S3.

The image processing part 4, the memory 7 and the incident X-ray detection part 6 may be integrated with the signal processing part 3.

The scintillator 5 is provided on a plurality of photoelectric conversion elements 2$b$1, and converts the incident X-ray to fluorescence. The scintillator 5 is provided to cover a region (effective pixel region) where a plurality of photoelectric conversion parts on the substrate 2$b$ are provided.

The scintillator 5 can be formed based on, for example, cesium iodide (CsI):thallium (Tl), or sodium iodide (NaI):thallium (Tl) or the like. In this case, if the scintillator 5 is formed by using a vacuum deposition method or the like, the scintillator 5 made of a plurality of columnar crystal aggregations is formed.

The scintillator 5 can be also formed by using, for example, oxysulfide gadolinium ($Gd_2O_2S$) or the like. In this case, a groove portion in a matrix can be provided so that the quadrangular prismatic scintillator 5 is provided every the plurality of photoelectric conversion parts 2$b$. The groove portion can be filled with an atmosphere (air) or an inactive gas such as antioxidant nitrogen gas. Or the groove portion may be in a vacuum state.

Other, in order to increase a utilization efficiency of the fluorescence and improve sensitivity characteristics, a reflection layer not shown can be provided so as to cover a surface side (incident surface side of X-ray) of the scintillator 5.

In order to suppress deterioration of the characteristics of the scintillator 5 and the characteristics of the reflection layer due to water vapor included in air, a moistureproof body not shown covering the scintillator 5 and the reflection layer can be provided.

Here, the X-ray detector 1 can configure the X-ray image as follows.

First, the control circuit 3 turns the thin film transistor 2$b$2 off. The thin film transistor 2$b$2 is turned off, and thus the definite charge is stored in the storing capacitor 2$b$3 via the bias line 2c3. Next, when the X-ray is irradiated, the X-ray is converted to the fluorescence by the scintillator 5. When the fluorescence is incident on the photoelectric conversion element 2b1, charges (electron and hole) are produced by the photoelectric effect, the produced charges and the stored charges (heterogeneous charge) combine and the stored charges decrease. Next, the control circuit 31 turns the thin film transistors 2b2 on sequentially. The signal detection circuit 32 reads out the stored charge stored (image data S2) in each storing capacitor 2b3 in accordance with the sampling signal via the data line 2c2. The signal detection circuit 32 converts the read image data S2 (analog signal) to the digital signal sequentially. The signal detection circuit 32 converts a value of the current flowing in the data line 2c2 when the thin film transistor 2b2 is in the off state.

The memory 7 saves temporarily the data obtained in the on state of the thin film transistor 2b2 as the image data S2. The memory 7 saves the data obtained in the off state of the thin film transistor 2b2 as the correction data S3.

The image processing part 4 configures the X-ray image based on the image data S2 saved in the memory 7. The image processing part 4 performs correction for suppressing the image spot described later by using the correction data S3 saved in the memory 7 when configuring the X-ray image. The data of the X-ray image having the correction for suppressing the image spot performed are output from the image processing part 4 toward an external equipment or the like.

Here, in a general X-ray detector, image operation starts as follows. First, incidence of the X-ray into the X-ray detector is recognized by the signal from the external equipment such as an X-ray source. Next, the thin film transistor 2b2 of the photoelectric conversion part 2b performing the reading is turned on after the passage of a predetermined time, and the stored charge is read out. That is, in the general X-ray detector, actual incidence of the X-ray into the X-ray detector is not detected.

Therefore, a prescribed time is needed to be provided between a time when the signal from the external equipment is input and a time when the reading operation is started. As a result, a time lag or the like occurs and a processing time is lengthened.

If the thin film transistor 2b2 of a semiconductor element is irradiated with the X-ray, a current flows between a drain electrode 2b2b and a source electrode 2b2c, even if the thin film transistor 2b2 is in the off state. The drain electrode 2b2b of the thin film transistor 2b2 is electrically connected to a data line 2c2. Therefore, based on a difference between a value of the current flowing in the data line 2c2 on the X-ray irradiation and a value of the current flowing, in the data line 2c2 on no X-ray irradiation, a start time of the X-ray incidence can be detected. If the start time of the X-ray incidence can be detected directly, the time lag or the like does not occur, and thus the processing time can be suppressed from being lengthened.

However, the value of the current flowing in the data line 2c2 when the thin film transistor 2b2 is in the off state becomes extremely small. Furthermore, since a large amount of X-ray irradiation to a human body has an adverse effect on health, the X-ray irradiation to the human body is suppressed to the minimum necessary. Therefore, in the case of the X-ray detector used for medical application, the intensity of the incident X-ray is extremely weak, and the value of the current flowing in the data line 2c2 becomes further small when the thin film transistor 2b2 is in the off state.

As a result, there is a fear that if the start time of the X-ray incidence is detected based on the value of the current flowing in the data line 2c2 when the thin film transistor 2b2 is in the off state, it is difficult to detect accurately the start time of the X-ray incidence.

Thus, the X-ray detector 1 according to the embodiment is provided with the following incident X-ray detection part 6.

The incident X-ray detection part 6 is electrically connected to the signal detection circuit 32. The incident X-ray detection part 6 judges the start time of the X-ray incidence based on the value of the current flowing in the data line 2c2 electrically connected to the thin film transistor 2b2 when the thin film transistor 2b2 is in the on state. That is, the incident X-ray detection part 6 judges the start time of the X-ray incidence based on the value of the image data S2 read out in the on state of the thin film transistor. For example, the incident X-ray detection part 6 can judge that the X-ray is incident, in the case where the X-ray detection part 6 detects the current flowing in the data line 2c2 connected to the thin film transistor 2b2 in the on state, and the value of the detected current exceeds a prescribed threshold value. The prescribed value can be set previously based on a difference between the value of the current flowing in the data line 2c2 on the X-ray irradiation and the value of the current flowing in the data line 2c2 on no X-ray irradiation. If the thin film transistor 2b2 is in the on state, an electrical resistance can be small compared with the case of the off state, and thus the value of the current flowing in the data line 2c2 becomes large. Therefore, it is easy to detect the start time of the X-ray. As described above, in the case of the X-ray detector used for medical application, the intensity of the incident X-ray is extremely weak. However, if the start time of the X-ray incidence is detected in the on state of the thin film transistor 2b2, it is possible to detect accurately the incident start time of the X-ray.

However, since the current from other thin film transistor 2b2 in the off state also flows in the data line 2c2 connected to the thin film transistor 2b2 in the on state, a new problem of occurrence of the image spot arises.

In this case, the current from the other thin film transistor 2b2 does not flow in the data line 2c2 connected to the thin film transistor 2b2 turned on after the irradiation of the X-ray is finished. Therefore, the image spot can be suppressed if the data at the start of the X-ray incidence are discarded and the X-ray image is configured by using only data after the irradiation of the X-ray is finished. However, in this way, since the data at the start of the X-ray incidence are lost, that will result in a decline in quality of the X-ray image.

Thus, the incident X-ray detection part 6 detects the current flowing in the data line 2c2 in at least one of the off state before turning on the thin film transistor 2b2 and the off state after turning on the thin film transistor 2b2. As previously described, it is considered that the occurrence of the image spot is mainly caused by the current from the thin film transistor 2b2 in the off state. Therefore, if the current flowing in the data line 2c2 connected to the thin film transistor 2b2 in the on state is detected in the off state at least one of before and after the on state, and the image data acquired at the on state is corrected by the correction data S3 acquired at the off state, the image spot can be suppressed drastically. In this way, since the image data S2 at the start of the X-ray incidence can be used, the decline of quality of the X-ray image can be suppressed.

That is, if the incident X-ray detection part 6 is provided, the start time of the X-ray incidence can be detected and deterioration of the quality of the X-ray image can be suppressed.

Figure 4:
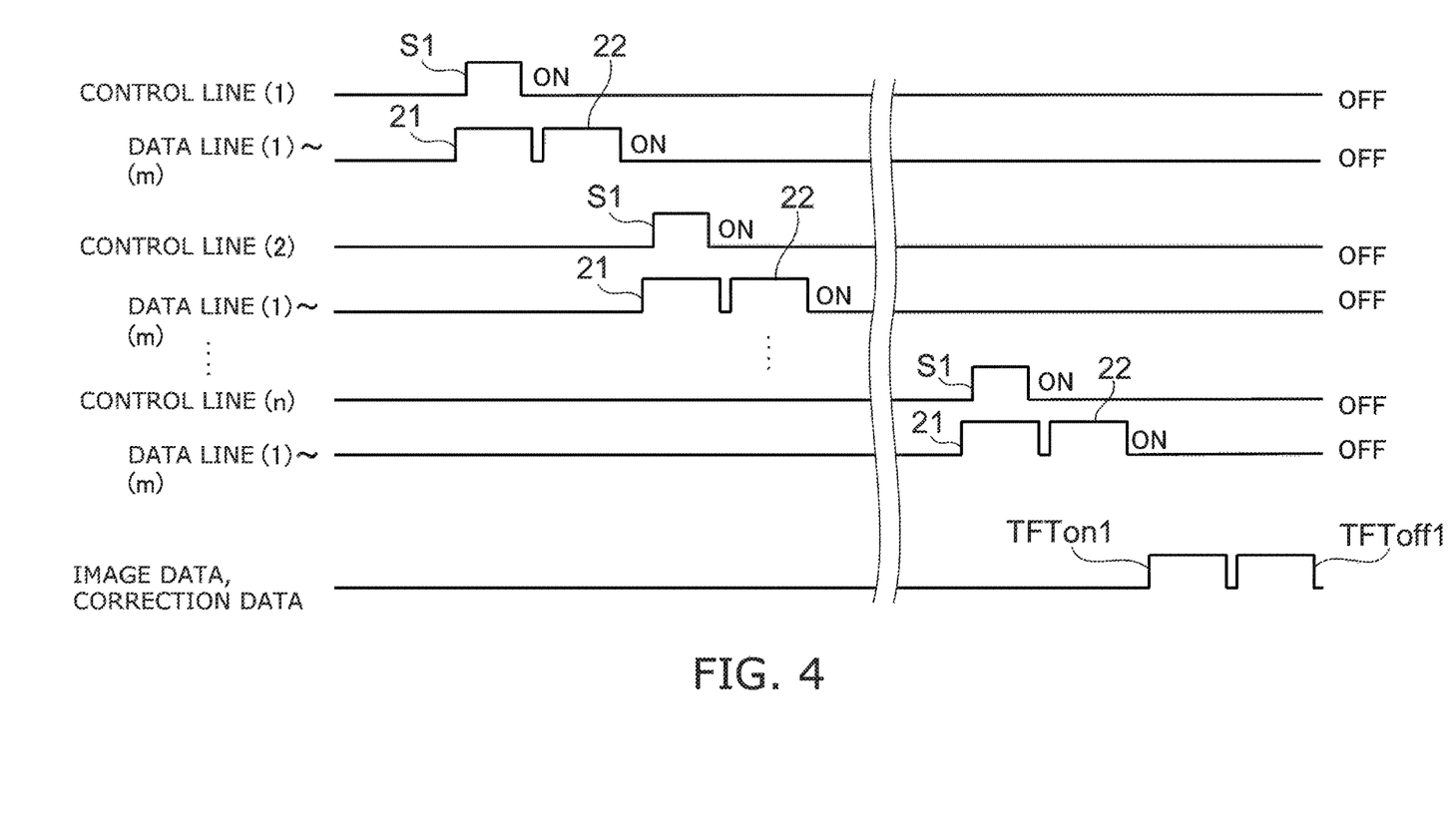
FIG. 4 is a timing chart for illustrating reading of image data and correction data.

FIG. 4 is a timing chart for illustrating reading of the image data S2 and the correction data S3.

FIG. 4 shows the case where n control lines 2c1 and m data lines 2c2 are provided.

First, the first sampling signal 21 is input to the signal detection circuit 32 from the image processing part 4 or the like. As shown in FIG. 4, the first sampling signal 21 is turned on, and thus the signal detection circuit 32 starts sampling for the data line (1)~the data line (m). The first sampling signal 21 is turned off after the passage of the prescribed time.

On the other hand, while the first sampling signal 21 is on, the control signal S1 is input to the control line (1) from the image processing part 4 or the like via the control circuit 31. The control signal S1 is turned on, and then the thin film transistor 2b2 electrically connected to the control line (1) is turned on. The control signal S1 is turned off after the passage of the prescribed time.

The signal detection circuit 32 reads out sequentially the image data S2 from the data line (1)~the data line (m) when the thin film transistor 2b2 is in the on state.

The incident X-ray detection part 6 judges the start time of the X-ray incidence based on the value of the current flowing in the data line 2c2 when the first sampling signal 21 is on.

Next, after the first sampling signal 21 is turned off, the second sampling signal 22 is input to the signal detection circuit 32 from the image processing part 4 or the like. The second sampling signal 22 is turned on, and then the signal detection circuit 32 starts sampling for the data line (1)~the data line (m). The second sampling signal 22 is turned off after the passage of the prescribed time.

In this case, the control signal S1 is not input to the control line (1), and the thin film transistor 2b2 electrically connected to the control line (1) remains to be in the off state.

The signal detection circuit 32 detects the current flowing in the data line (1)~the data line (m) when the thin film transistor 2b2 is in the off state.

After that, the above procedure is performed for the control line (2)~the data line (n).

The data acquired in this way are saved in the memory 7. The data acquired when the thin film transistor 2b2 is in the on state serve as the image data S2 of n rows and m columns. The data acquired when the thin film transistor 2b2 is in the off state serve as the correction data S3 of n rows and m columns.

The case where the image data S2 and the correction data S3 are saved in the same memory 7 is illustrated, however the image data S2 and the correction data S3 may be saved in separate memories.

When the data serving as the image data S2 and the data serving as the correction data S3 are saved in the memory 7, the image indexes can be given. In the case illustrated in FIG. 4, an image index TFTon1 is given to the image data S2, and an image index TFToff1 is given to the correction data S3 coupling with the image data S2. In this case, the image index TFTon1 represents the image data S2 firstly acquired, and the TFToff1 represents the correction data S3 coupling with this. The image indexes can be given to the data with respect to the control line (1)~the control line (n), respectively.

In FIG. 4, the second sampling signal 22 is turned on after the first sampling signal 21 is turned off, however the first sampling signal 21 may be turned on after the second sampling signal 22 is turned off. That is, in FIG. 4, the correction data S3 is acquired after acquiring the image data S2, however the image data S2 may be acquired after acquiring the correction data S3.

When the control signal S1 is input to one control line, the second sampling signal 22, the first sampling signal 21, and the second sampling signal 22 may be sequentially input to the signal detection circuit 32. In this case, it is possible that when the control signal S1 is input to the next signal line, only the first sampling signal 21 is input to the signal detection circuit 32, when the control signal S1 is input to the still next control line, the second sampling signal 22, the first sampling signal 21, and the second sampling signal 22 can be input to the signal detection circuit 32, sequentially.

That is, the first sampling signal 21 and the second sampling signal 22 are only necessary to be input alternately.

In FIG. 4, the first sampling signal 21 is turned on before turning the control signal S1 on, however the control signal S1 and the first sampling signal may be turned on simultaneously, and the first sampling signal 21 may be turned on after turning the control signal S1 on.

In FIG. 4, the first sampling signal 21 is turned off after turning the control signal S1 off, however the control signal S1 and the first sampling signal 21 may be turned off simultaneously, and the first sampling signal 21 may be turned off before turning the control signal S1 off.

Next, alternate input of the first sampling signal 21 and the second sampling signal 22 (alternate reading the image data S2 and the correction data S3) will be further described.

Figure 5:
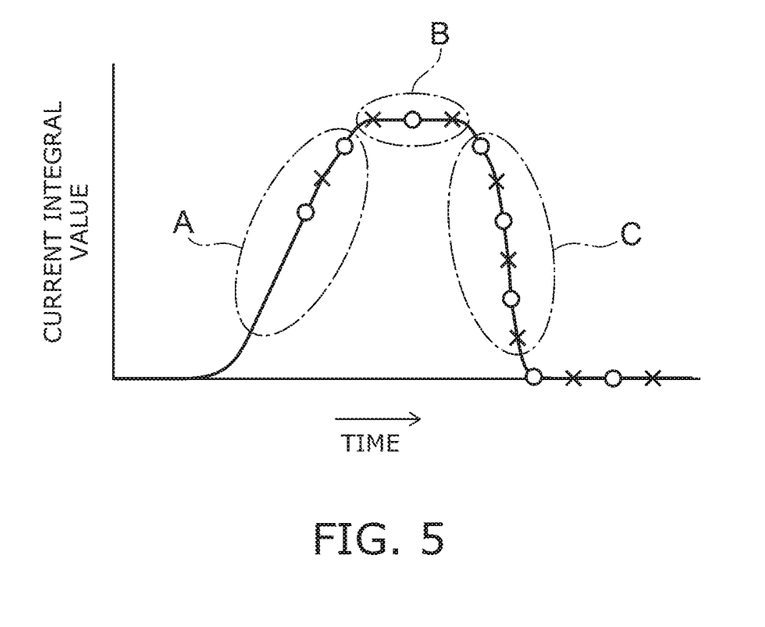
FIG. 5 is a schematic view for illustrating, a current flowing in a data line when the X-ray is irradiated.

FIG. 5 is a schematic view for illustrating the current flowing in the data line 2c2 when the X-ray is irradiated.

"Circle" in FIG. 5 represent timing when the first sampling signal 21 is turned on, and "cross" represents timing when the second sampling signal 22 is turned on.

When the X-ray detector 1 is irradiated with the X-ray, a wave current as illustrated in FIG. 5 flows in the data line 2c2.

In this case, a change of a current value per unit time becomes large in a region A or a region C. On the other hand, a change of a current value per unit time becomes small in a region B.

Here, the correction data S3 described previously is favorably acquired under the same condition as the image data S2 when possible. Therefore, the first sampling signal 21 and the second sampling signal 22 are favorably input in the region B.

However, since it is unknown when the start time of the X-ray incidence is, it is difficult to input the first sampling signal 21 and the second sampling signal 22 in the region B.

Thus, in the X-ray detector 1 according to the embodiment, the first sampling signal 21 and the second sampling signal 22 are input alternately.

For example, in the case illustrated in FIG. 5, as shown in FIG. 4, the first sampling, signal 21 about the control line (1) is input, and subsequently the second sampling signal 22 is input.

Next, the first sampling signal 21 about the control line (2) is input, and subsequently the second sampling signal 22 is input.

Below, in the same way, the first sampling signal 21 and the second sampling signal 22 are input alternately.

In this way, with respect to one image data, the correction data S3 before and after that can be obtained. If the before and after correction data S3 can be acquired, for example, a average value can be determined. Therefore, even if the change of the current value per unit time is large, the acquisition condition of the correction data S3 can be close to acquisition condition of the image data S2. As a result, since the correction accuracy can be improved, the image spot is suppressed easily.

Figure 6:
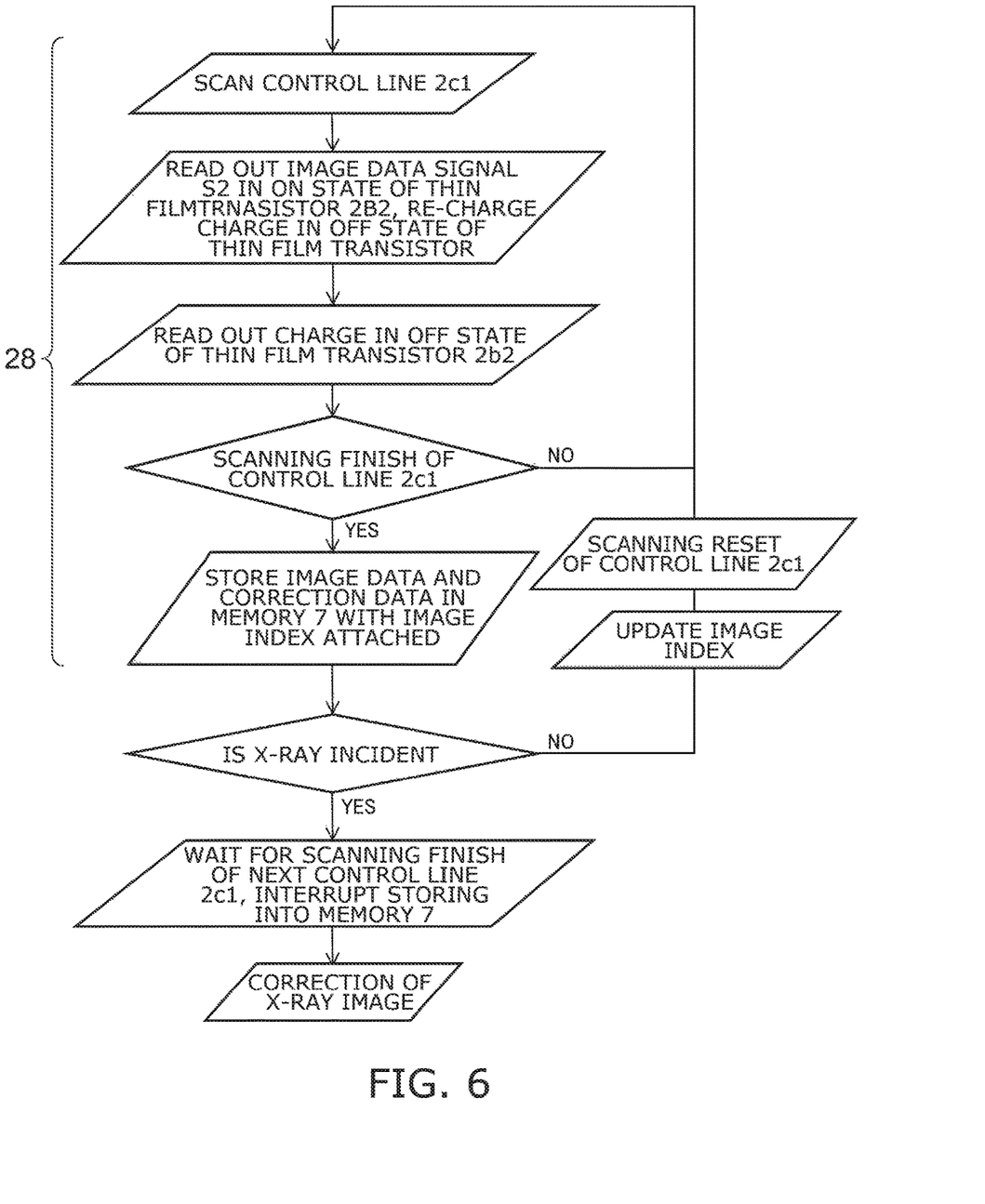
FIG. 6 is a flow chart for illustrating a process in the X-ray detector.

FIG. 6 is a flow chart for illustrating the process of the X-ray detector 1.

As shown in FIG. 6, in a reading process 28, the control line 2c1 is scanned, and the image data S2 is read out in the ON state of the thin film transistor 2b2. The correction data S3 is read out in the OFF state of the thin film transistor 2b2.

The image data S2 and the correction data S3 of every control line 2c1 are saved in the memory 7 with attaching the image indexes.

Next, the incidence of the X-ray is judged based on the image data S2 saved in the memory 7.

For example, when the image numbers exceeding a predetermined threshold value are counted and the image numbers reaches a predetermined count number, it can be judged that the X-ray is incident.

In the above, the judge of the X-ray incidence is performed by using the image data S2 when the thin film transistor 2b2 is in the ON state, however the signal of the integration period in the process of reading the image data S2 in the ON state of the thin film transistor 2b2 and recharging the charge may be used for judge of X-ray incidence. In this way, the X-ray incidence can be known in an earlier stage.

When it is judged that the X-ray is not incident, the image index is updated and the scanning of the control line 2c1 is reset. That is, the scanning is started from the control line (1), and the above procedure is repeated.

When it is judged that the X-ray is incident, after the scanning of the control line 2c1 in the next period is finished, at the stage where the image data S2 and the correction data S3 are saved in the memory 7, the save into the memory 7 is interrupted. The save into the memory 7 is interrupted, and thereby already saved image data S2 and the correction data S3 are prevented from being overwritten.

Subsequently, the image data S2 and the correction data S3 after the incidence of the X-ray are extracted based on the image index given in the period when the X-ray is judged to be incident, and the X-ray image is configured by the image processing part 4. At this time, the image spot is suppressed by correcting the image data S2 by using the correction data S3.

Next, the suppression of the image spot will be further described.

As described previously, when the control line 2c1 is scanned sequentially in the ON state of the thin film transistor 2b2 and the incidence of the X-ray is judged from the obtained image data S2, the image spot occurs. The image spot is considered to be caused mainly as follows. A plurality of thin film transistors are electrically connected to one data line 2c2. In the case where the control line 2c1 is scanned and the thin film transistors 2b2 electrically connected to the desired control line 2c1 is in the on state, the thin film transistors 2b2 electrically connected to other control lines 2c1 is in the OFF state. If the thin film transistor 2b2 is in the OFF state, a current does not flow between the source electrode 2b2c and the drain electrode 2b2b. However, the thin film transistor 2b2 is irradiated with the X-ray or the fluorescence converted by the scintillator 5, the resistance value between the source electrode 2b2c and the drain electrode 2b2b decreases. If the resistance value decreases, a portion of charges stored in the storing capacitor 2b3 is released to the data line 2c2 and serves as the current flowing in the data line 2c2. The image spot is considered to occur due to this current.

Here, the resistance value between the source electrode 2b2c and the drain electrode 2b2b changes by strength of the X-ray incident to the X-ray detector 1. For example, the strength of the X-ray incident to the X-ray detector 1 changes drastically at the start time or the end time of the X-ray incidence. Therefore, the resistance value between the source electrode 2b2c and the drain electrode 2b2b changes also drastically at the start time or the end time of the X-ray incidence. In this case, as illustrated in FIG. 5, the current flowing in the data line 2c2 also changes drastically.

In order to suppress the image spot effectively, in the case where the thin film transistor 2b2 electrically connected to the desired control line 2c1 is in the on state, it is necessary to know the resistance value change of the thin film transistor 2b2 in the off state electrically connected to other control lines 2c1.

As described previously, if at a timing before and after tuning the thin film transistor 2b2 ON (turning the first sampling signal on), all thin film transistors 2b2 is in the OFF state, the second sampling signal 22 is on, and currents flowing in all data lines 2c2 are detected, it is possible to know the resistance value change.

If the correction data S3 made from the currents in all data lines 2c2 is used, the image spot can be suppressed effectively.

The number of the data lines 2c2 of the general X-ray detector is not less than 500 lines, however many thin film transistors 2b2 are in the OFF state, and thus the image spot can be, corrected accurately. If the correction is made in the above procedure, it is possible to correct the image spot in real time.

If ON time of the first sampling signal 21 and the second sampling signal 22 are changed, the value of the current integral value illustrated in FIG. 5 variates. On the other hand, the value of the current integral value illustrated in FIG. 5 has no relation to a time during which the thin film transistor 2b2 is in the on state (ON time of control signal S1).

When the first sampling, signal 21 is turned ON, integration of the current flowing in the data line 2c2 starts, and when the first sampling signal 21 is turned OFF, the integration ends. The current value which flows during the ON time of the first sampling signal 21 is integrated to be output as the digital signal (current integral value).

There is a fear that the quality of the X-ray image may be deteriorated unless the time during which the thin film transistor 2b2 is in the on state is made long, to some extent. However, while the X-ray is irradiated, it is not necessary to lengthen the time during which the thin film transistor 2b2 is in the on state, and it is preferable to shorten the time during which the thin film transistor 2b2 is in the on state and decrease the current integral value in order to decrease the influence of the leak current. On the other hand, after the X-ray irradiation is finished, there is no leak current, and thus it is preferable to lengthen the time during which the thin film transistor 2b2 is in the on state.

In this case, since the irradiation time of the X-ray is short, the sampling time for reading out the image data S2 and the time during which the thin film transistor 2b2 is in the on state after the incidence of the X-ray is detected can be longer than the sampling time for reading out the image data S2 and the sampling time for reading out the correction data S3 before the incidence of the X-ray is detected.

In this way, the occurrence of the image spot can be suppressed and the quality of the X-ray image can be improved.

Figure 7:
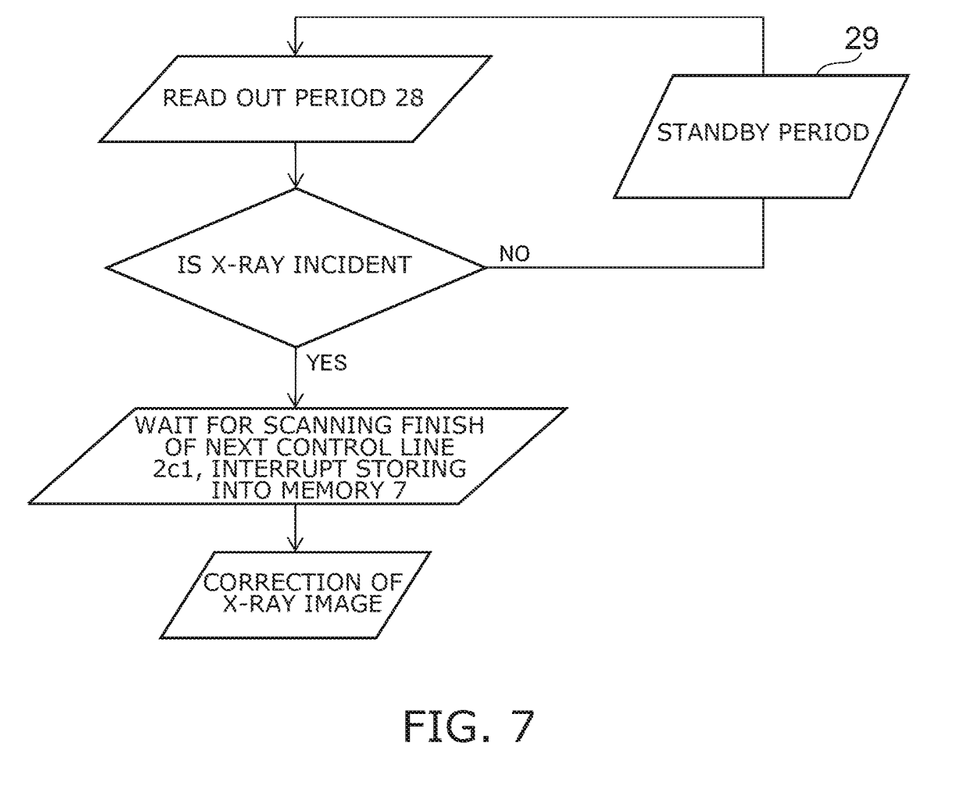
FIG. 7 is a flow chart for illustrating other process.

FIG. 7 is a flow chart for illustrating, other process.

As shown in FIG. 7, in the case where the X-ray is judged not to be incident, standby process 29 for standing by for a definite time can be provided before going back to a reading process 28.

In the standby process 29, the scanning of the control line 2c1, and acquisition of the image data S2 and the correction data S3 are interrupted.

In the case where the X-ray is irradiated in the state of the standby process 29, the control line 2c1 is not scanned, and thus the image spot due to the change of the resistance value described above does not occur. In this case, it can be decided whether the correction of the image data S2 is necessary or not based on the correction data S3 in the reading process 28.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. Moreover, above-mentioned embodiments can be combined mutually and can be carried out.

What is claimed is:

1. A radiation detector, comprising:
a substrate;
a plurality of control lines provided on the substrate and extending in a first direction;
a plurality of data lines provided on the substrate and extending in a second direction crossing the first direction;
a plurality of detection parts arranged in a matrix, each of the plurality of detection parts including a thin film transistor and a conversion part, the thin film transistor electrically connected to one of the plurality of control lines and one of the plurality of data lines, the conversion part electrically connected to the thin film transistor, the conversion part configured to convert radiation or light into electricity;
a control circuit configured to, for each detection part of the plurality of detection parts, switch an on state and an off state of the thin film transistor included in the detection part;
a signal detection circuit configured to, for each detection part of the plurality of detection parts, read out image data in the on state of the thin film transistor included in the detection part; and
an incident radiation detection part configured to detect a start of radiation incidence, based on a value of the image data read out in the on state of the thin film transistor included in one of the plurality of detection parts,
wherein the control circuit is further configured to, during a process of scanning each of the plurality of control lines extending in the first direction:
select a first control line of the plurality of control lines by switching the thin film transistors electrically connected to the first control line to the on state,
select a second control line of the plurality of control lines by switching the thin film transistors electrically connected to the second control line to the on state, and
select a third control line of the plurality of control lines by switching the thin film transistors electrically connected to the third control line are switched to the on state,
wherein the signal detection circuit is further configured to, during the process of scanning each of the plurality of control lines extending in the first direction:
read out the image data by reading out signals of each of the plurality of data lines electrically connected to the thin film transistors switched in the on state, and
read out correction data by reading out signals of each of the plurality of data lines between selecting the first control line and selecting the second control line and between selecting the second control line and selecting the third control line, wherein each of the thin film transistors of the plurality of detection parts is in the off state during the read out of the correction data.

2. The radiation detector according to claim 1, further comprising an image processing part configured to process a radiation image based on the image data, wherein the image processing part is configured to correct the image data using the correction data.

3. The radiation detector according to claim 2, wherein the signal detection circuit is further configured to, during the process of scanning the plurality of control lines extending in the first direction, provide image indexes identifying the image data and the correction data read out at a time of reading out the image data, after reading out the image data, or both before reading out the image data and after reading out the image data.

4. The radiation detector according to claim 3, wherein the image processing part is further configured to extract the image data and the correction data based on the image indexes, process the correction data, and correct the image data by using the processed correction data.

5. The radiation detector according to claim 1, wherein the signal detection circuit is further configured to, during the process of scanning the plurality of control lines extending in the first direction, convert a difference between the read out image data and the read out correction data into a digital signal and output the digital signal.

6. The radiation detector according to claim 1, wherein the control circuit is further configured to, in response to the incident radiation detection part detecting the start of radiation incidence, scan the plurality of control lines repeatedly.

7. The radiation detector of claim 1, wherein the signal detection circuit is further configured to read out both of the image data and the correction data every time a control signal for scanning one of the plurality of control lines extending in the first direction is output from the control circuit.

8. The radiation detector of claim 1, wherein the signal detection circuit is configured to read out the correction data immediately before and immediately after reading out the image data, during the process of scanning the plurality of control lines extending in the first direction.

* * * * *